(12) United States Patent
Patel et al.

(10) Patent No.: US 10,365,127 B2
(45) Date of Patent: Jul. 30, 2019

(54) DATA LOGGING DEVICE

(71) Applicant: SIGNIFY HOLDING B.V., Eindhoven (NL)

(72) Inventors: Maulin Dahyabhai Patel, Tuckahoe, NY (US); Vikrant Suhas Vaze, White Plains, NY (US); Saeed Reza Bagheri, Croton on Hudson, NY (US)

(73) Assignee: SIGNIFY HOLDING B.V., Eindhoven (NL)

( * ) Notice: Subject to any disclaimer, the term of this patent is extended or adjusted under 35 U.S.C. 154(b) by 173 days.

(21) Appl. No.: 14/900,297

(22) PCT Filed: Jun. 18, 2014

(86) PCT No.: PCT/IB2014/062323
§ 371 (c)(1),
(2) Date: Dec. 21, 2015

(87) PCT Pub. No.: WO2014/207612
PCT Pub. Date: Dec. 31, 2014

(65) Prior Publication Data
US 2016/0370208 A1    Dec. 22, 2016

Related U.S. Application Data

(60) Provisional application No. 61/840,546, filed on Jun. 28, 2013.

(51) Int. Cl.
*G01D 4/00* (2006.01)
*G01D 9/28* (2006.01)
(Continued)

(52) U.S. Cl.
CPC .............. *G01D 9/285* (2013.01); *G01D 4/00* (2013.01); *G01D 9/38* (2013.01); *G01R 21/133* (2013.01);
(Continued)

(58) Field of Classification Search
CPC ........ G01D 9/285; G01D 9/38; G01R 21/133; G05B 15/02; G05B 2219/2642
(Continued)

(56) References Cited

U.S. PATENT DOCUMENTS

D656,849 S    4/2012  Ni
D664,456 S    7/2012  Trine
(Continued)

FOREIGN PATENT DOCUMENTS

CN        101489290 A      7/2009
CN        103064109 A      4/2013
DE     102010046417 A1     3/2012

OTHER PUBLICATIONS

Guo, X. et al "The Performance of Occupancy-based Lighting Control Systems: A Review", Lighting Research and Technology, 2010.
(Continued)

*Primary Examiner* — Frederick B Hargrove
*Assistant Examiner* — Patricia D Reddington

(57) ABSTRACT

System and methods for data logging are disclosed. The method comprising performing an initialization process, performing a data collection process in which data from a plurality of sensors is collected and time stamped, performing a time correction on the time-stamp data based on patterns of time and occupancy, performing an estimation of a light state based on the corrected time stamped data and determining an energy saving using an automatic light operation based on determined light state estimation.

18 Claims, 10 Drawing Sheets

(51) Int. Cl.
*G01D 9/38* (2006.01)
*G01R 21/133* (2006.01)
*G05B 15/02* (2006.01)

(52) U.S. Cl.
CPC ...... *G05B 15/02* (2013.01); *G05B 2219/2642* (2013.01); *Y02B 90/245* (2013.01); *Y04S 20/38* (2013.01); *Y04S 20/40* (2013.01)

(58) Field of Classification Search
USPC .......................................................... 702/60
See application file for complete search history.

(56) References Cited

U.S. PATENT DOCUMENTS

| | | | |
|---|---|---|---|
| 2007/0140295 A1 | 6/2007 | Akaboshi | |
| 2008/0068217 A1* | 3/2008 | Van Wyk | G01D 4/004 340/870.11 |
| 2008/0263105 A1 | 10/2008 | Nakamura | |
| 2009/0281674 A1* | 11/2009 | Taft | G01D 4/002 700/286 |
| 2010/0303185 A1* | 12/2010 | Haartsen | H04W 52/0216 375/362 |
| 2010/0304931 A1 | 12/2010 | Stumpf | |
| 2011/0029370 A1 | 2/2011 | Roeding | |
| 2011/0191058 A1* | 8/2011 | Nielsen | B65D 83/203 702/130 |
| 2012/0054379 A1* | 3/2012 | Leung | G06F 1/3206 710/23 |
| 2012/0066168 A1 | 3/2012 | Fadell | |
| 2012/0086568 A1 | 4/2012 | Scott | |
| 2012/0098432 A1 | 4/2012 | Recker | |
| 2013/0094372 A1 | 4/2013 | Boot | |

OTHER PUBLICATIONS

Vonneida, Bill et al "An Analysis of the Energy and Cost Savings Potential of Occupancy Sensors for Commercial Lighting Systems", Journal of Illuminating Engineering Society, 2001. 30(2): p. 111-125.

Galasiu, Anca D. et al "Energy Saving Lighting Control Systems for Open-Plan Offices: A Field Study", Ingineria Iluminatului 2009, vol. 11, No. 2.

* cited by examiner

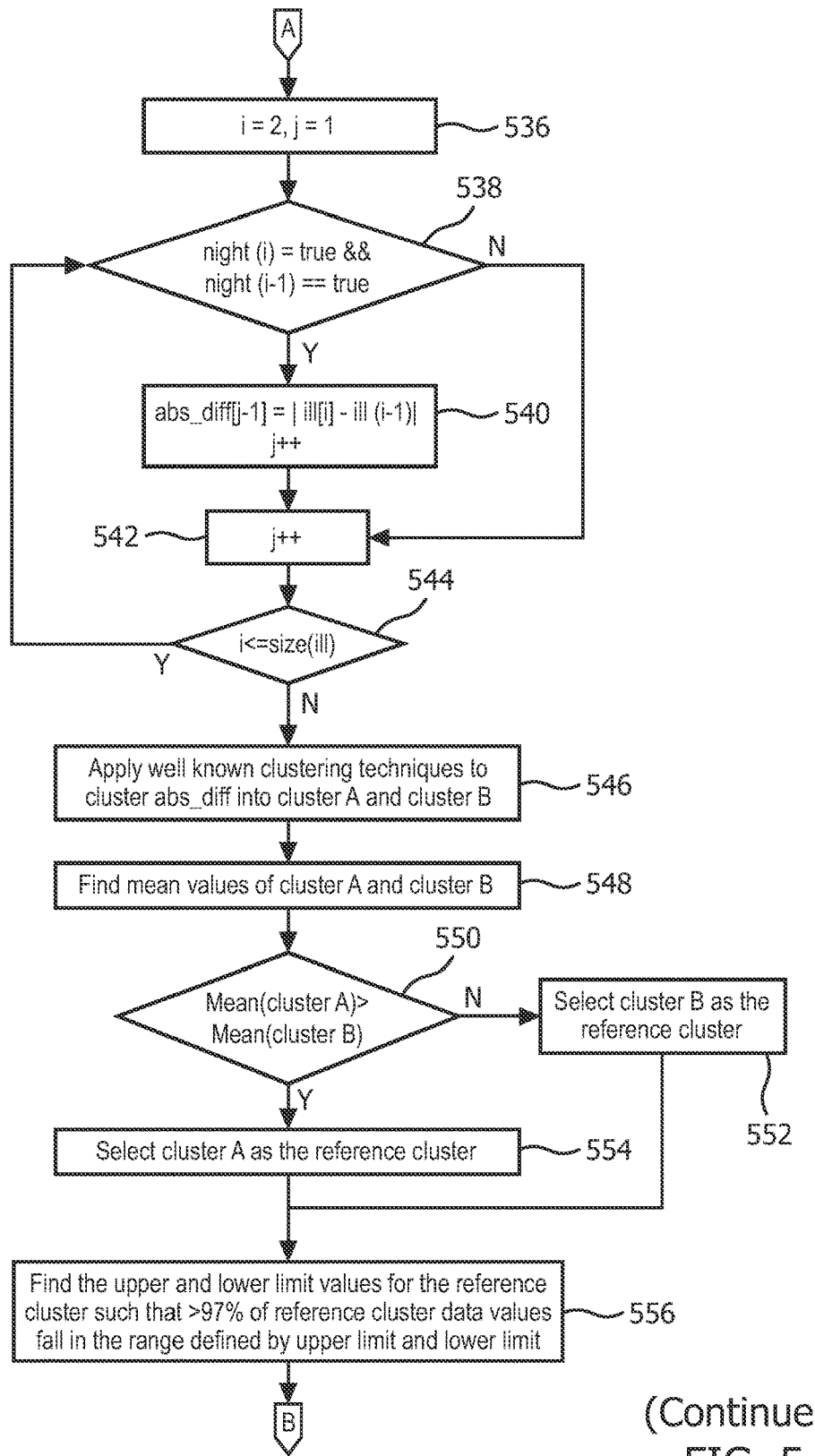
FIG. 5 (Continue)

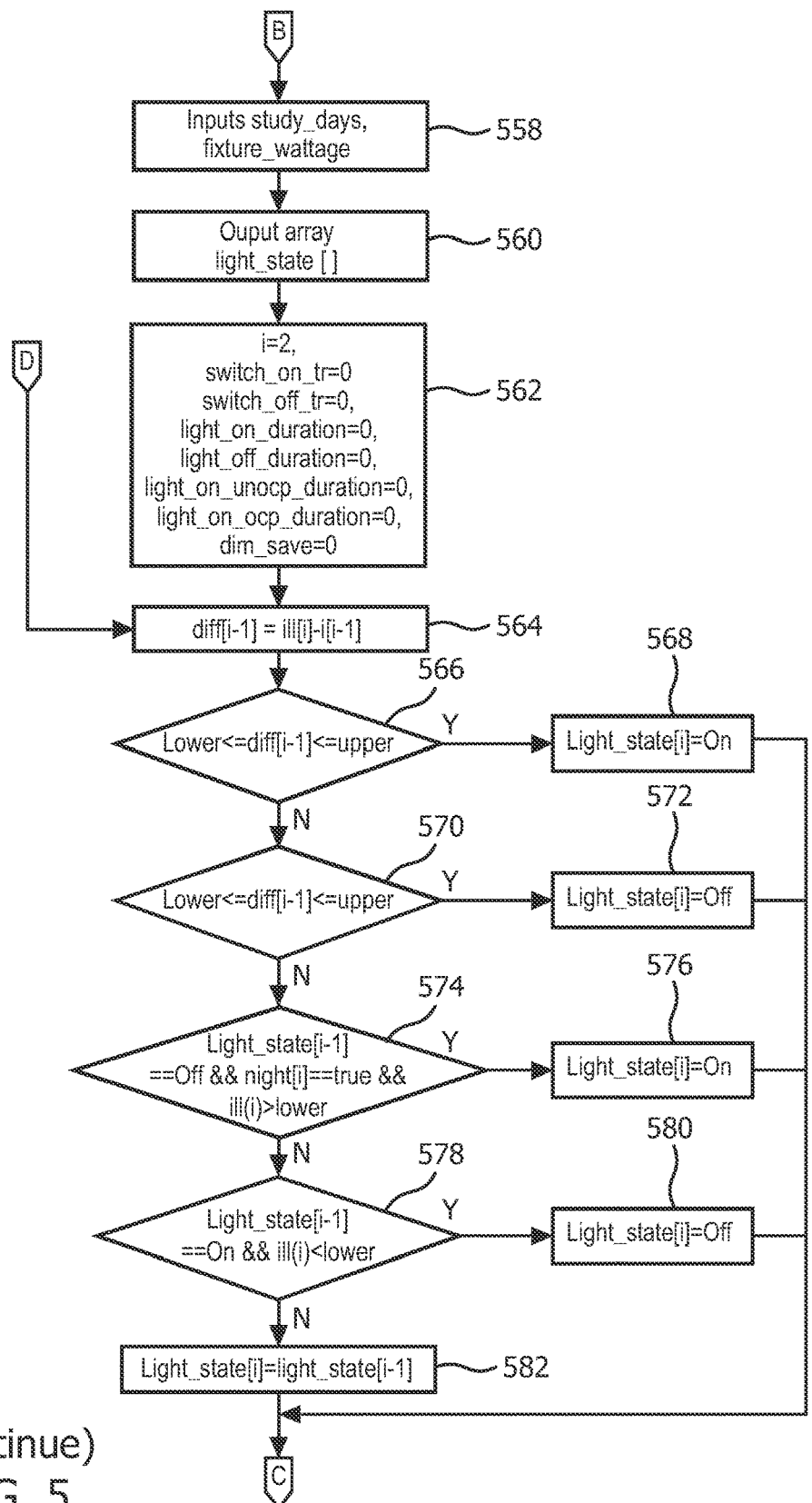
FIG. 5 (Continue)

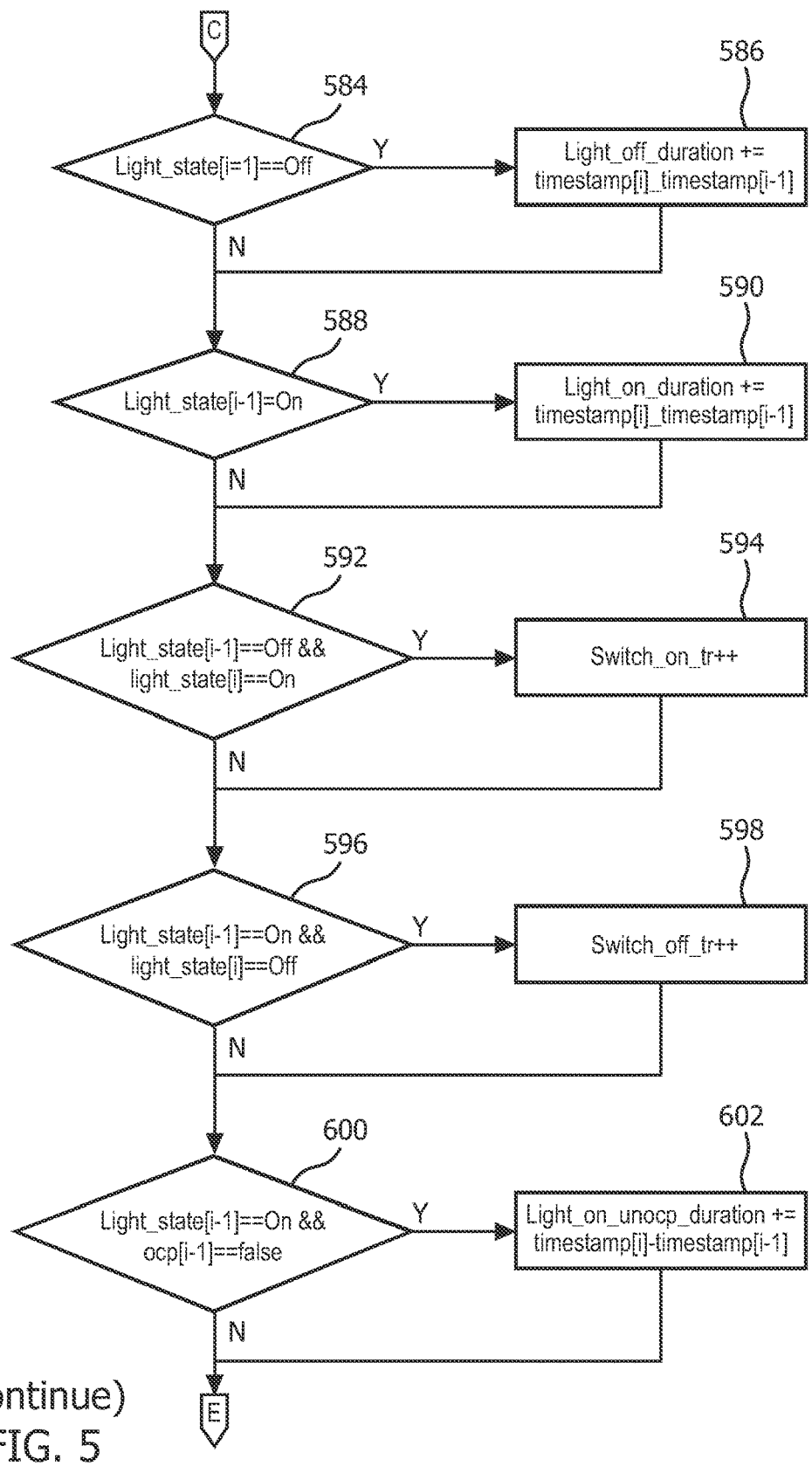
(Continue) FIG. 5

DATA LOGGING DEVICE

CROSS-REFERENCE TO PRIOR APPLICATIONS

This application is the U.S. National Phase application under 35 U.S.C. § 371 of International Application No. PCT/IB2014/062323, filed on Jun. 18, 2014, which claims the benefit of U.S. Provisional Patent Application No. 61/840,546, filed on Jun. 28, 2013. These applications are hereby incorporated by reference herein.

This application is related to the field of portable electronic devices and more particularly to a portable data logging device providing accurate timing utilizing a low cost power source.

Portable devices, such as radios, smoke detectors, pocket cameras and similar electronic devices are well-known in the art. Generally, these devices use standardized batteries, which may be of an alkaline type or a rechargeable type (e.g., NiCad, NiMHd, Lithium ion).

Generally these devices do not require high accurate time measurement as time is not a critical element in the operation of these devices.

However, in the recent years, there has been a push toward understanding the actual temporal patterns in occupancy, illumination, temperature, etc. of an indoor space before recommending and implementing a specific type of control technology. Also, scientific studies are using mathematical models and algorithms based on past usage patterns to predict future energy usage in indoor spaces on a case-by-case basis. See for example, US Published Patent Application, 2012/0066168 (2012).

Therefore, data loggers are becoming more and more useful to log actual usage and occupancy data at individual sites. The logged information may then be used to present evidence for the implementation of specific control equipment in corresponding sites.

In understanding the characteristics and usage patterns of a specific indoor space, the value of having more data cannot be overstated. All the calculations done using the logged data rely on the accuracy and stability of the logged data. Having a longer time period of data collection is therefore highly attractive to enhance the confidence in such calculations. However, the logging time period cannot exceed the battery life.

In one case, an accurate clock, such as a Crystal Quartz clock, can yield a high accuracy in time measurements (of the order of 20 parts per million). However, such accuracy consumes electrical power at a high rate; thus draining the battery.

Thus, portable devices (e.g., data loggers) that are currently being used for collecting data (e.g. energy usage characteristics) cannot log data accurately over a long enough logging duration using high accuracy clock that requires an expensive and powerful battery (e.g., alkaline, or rechargeable).

Thus, using a low-power clock, such as RC (resistor-capacitor) circuit clock, for a major portion of the logging time period, can overcome the problem of battery drain and increase the logging time period. But this introduces another challenge. The low accuracy of the RC clock means that the error in measured timestamps can be as high as 2% or 3%. Consequently, over a time period of 2 or 3 months, the accumulated error can be as high as 2 or 3 days. With such high errors, visualization and interpretation of the logged data becomes almost impossible.

Hence, there is a need in the industry for a portable data logging device that provides accurate time measurement using low power clock sources.

It is an object of the present invention to provide methods and systems for overcoming problems caused by using a low power, low accuracy clock source to obtain high accuracy time measurements.

It is an object of the present invention to provide for a portable system for data logging that achieves a high accuracy time measurement using a low power, low accuracy clock.

It is an object of the present invention to provide a method for determining a high accuracy time measurement using a low power, low accuracy clock.

It is an object the present invention to provide a portable data logging device that incorporates a plurality of sensors, the outputs of which may be logged using a low power low accuracy clock.

In one aspect of a portable device in accordance with the principles of the invention uses a low-power, low-accuracy clock, such as a resistor-capacitor (RC) clock, for collecting timestamp data and processing the collected data for correcting time errors using time and occupancy patterns. In accordance with the principles of the invention, a low power portable device that includes a low cost, low accuracy clock source collects and time stamps the collected data and processes the time stamped collected data to estimate a clock skew (also known as clock drift) in the timestamp-ed data. The estimated clock skew estimate may be used to correct the time stamped data.

In accordance with the principles of the invention, a system for logging sensor data and creating energy consumption pattern in an area is disclosed in which the system comprises a low-accuracy clock and a processor in communication with a memory, the processor receiving data items from each of a plurality of sensors, associating a time stamp generated by the low-accuracy clock with each data item received from each of the plurality of sensors, storing the received data items for a predetermined period of time and processing the stored data items after the predetermined period of time. The processor further determining a high accuracy time stamp for each of the stored data items and determining at least one period of time in which a light is at least one of on and off, determining at least one period of time in which the area is at least one of occupied and unoccupied, determining an average value for each of at least one period of time in which a light is on and at least one period of time in which the area is unoccupied, and determining an energy savings using an automatic light operation from the average values.

In another aspect of the invention, a data logging device is disclosed. The data logging device comprising means for receiving inputs from at least one of a plurality of devices, a low-accuracy clock, a processor in communication with a memory, the processor, receiving at least one input from the at least one of a plurality of devices, associating a time-stamp from the low-accuracy clock with each of the at least one input from the at least one of a plurality of devices, storing the at least one input and associated time-stamp for a predetermined time, generating a correction value of each of the low-accuracy clock time-stamps after the predetermined time has expired, applying the correction value to each of the low-accuracy clock time-stamps, the correction being based on predetermined time and occupancy patterns, processing the time-stamp-corrected stored inputs to determine energy patterns within the stored data, determining at least one period of time in which a light is at least one of on and off, determining at least one period of time in which the area is at least one of occupied and unoccupied, determining an average value for each of at least one period of time in which a light is on and at least on period of time in which the area is unoccupied, determining an energy savings using an automatic light operation from the average values and storing the determined values.

In another aspect of the invention, a method operable in a data logging device is disclosed in which a processor performs the steps of performing an initialization process comprising: determining at least one of a geographic location and a time, performing a data collection process comprising: receiving data items from at least one sensor for a predetermined period of time; associating a time-stamp with each of the received data items, the time-stamp being associated with a low-accuracy clock; storing the received data items and associated time-stamp; performing a time correction on the time-stamp data; performing an estimation of a light state comprising: determining at least one period of time in which a light is on and at least one period of time in which the area is unoccupied, determining an average value of each of at least one period of time in which the light is on and the area is unoccupied, and determining an energy saving using an automatic light operation based on the average values.

The advantages, nature, and various additional features of the invention will appear more fully upon consideration of the illustrative embodiments to be described in detail in connection with the accompanying drawings wherein like reference numerals are used to identify like elements throughout the drawings.

It is to be understood that the figures and descriptions of the present invention described herein have been simplified to illustrate the elements that are relevant for a clear understanding of the present invention, while eliminating, for purposes of clarity only, many other elements. However, because these eliminated elements are well-known in the art, and because they do not facilitate a better understanding of the present invention, a discussion of such elements or the depiction of such elements is not provided herein. The disclosure herein is directed also to variations and modifications known to those skilled in the art.

It will be further understood that the present invention is described with regard to a specific implementation of a portable device requiring high accuracy time stamping, wherein data is collected and logged to determine energy usage. However, it would be appreciated that the determination of a high accuracy timestamp using low cost power sources may be applied to other types of portable devices, without altering the scope of the invention.

In the specific field of energy management, occupancy sensors are sensing devices commonly connected to a room's lighting, which shut down these services when the space is unoccupied. Daylight harvesting is a type of lighting control designed to maintain a desired light level by reducing the use of artificial light when natural daylight is available. Occupancy sensors for lighting control use infrared (IR) or acoustic technology, or a combination of the two. The daylight harvesting techniques rely on sensor data collected from a photo-sensor such as a photo-diode. Occupancy sensing and daylight harvesting technologies have been widely studied in literature and several commercial products are available (e.g. Philips' OccuSwitch Sensors, Leviton's Universal Vacancy/Occupancy Sensors, Acuity's Sensor Switch, WattStopper's wall switch sensors, etc.). Savings potential of the order of 30% to 50% has often been estimated by switching off the light when a space is unoccupied, while savings potential of the order of 20-60% has been estimated for daylight harvesting-based close loop dimming controls in some other studies.

Figure 1:
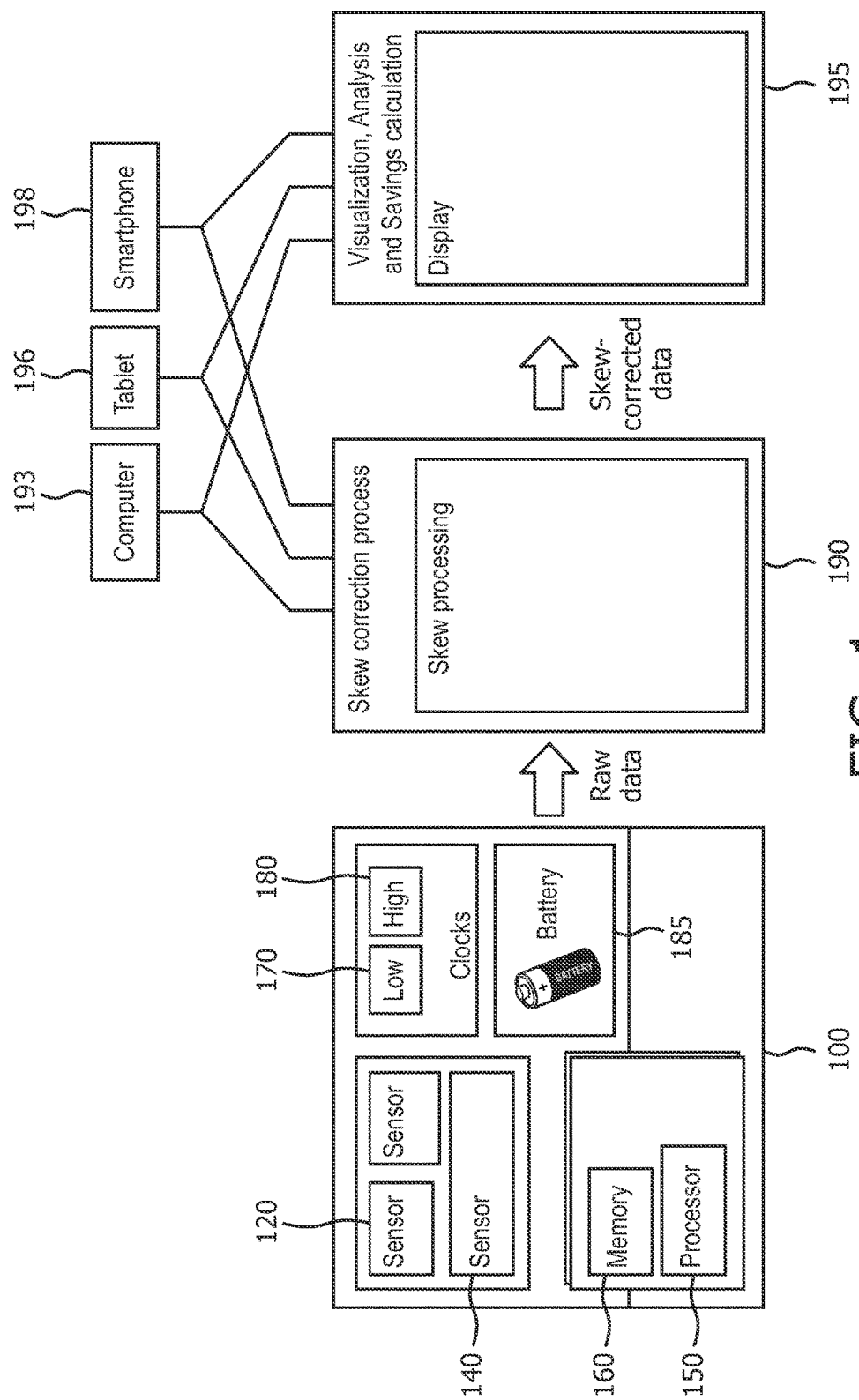
FIG. 1 illustrates a block diagram of a portable device in accordance with the principles of the invention.

FIG. 1 illustrates a block diagram of a portable device in accordance with the principles of the invention.

Referring to FIG. 1, there is shown a portable device 100 including a plurality of sensors, such as occupancy 120, photoelectric 130, temperature 140. Occupancy sensor 120 monitors the presence of a person within an area monitored by portable device 100. Photoelectric sensor 130 monitors a lighting level within an area monitored by portable device 100. Temperature sensor 140 monitors a temperature (heating, cooling) of an area monitored by portable device 100. Other sensors which are not shown may also be incorporated into the portable device 100, without altering the scope of the invention.

Although, portable device 100 is shown incorporating the illustrated sensors, it would be appreciated that such incorporation of sensors provides for complete portability. However, it would be understood that portable device 100 may include one or more communication ports (e.g., wired—serial, parallel, USB, and/or wireless) (not shown). In this case, one or more of sensors may be separately provided and the data collected is based on the particular sensors that are in communication with the portable device 100. In another aspect, the portable device 100 may include a combination of local sensors (e.g., illustrated sensors 120, 130, 140) and remote sensors (not shown) in communication with the portable device through the, not shown, one or more communication ports.

FIG. 1 further illustrates a processor 150 and memory 160 for collecting and storing the data received from each sensor. The processor 150 and memory 160 may be a low-powered dedicated hardware that consumes low power.

Also shown in FIG. 1, is a low cost, low accuracy, clock circuit 170. Clock circuit 170 may, for example, be an R-C circuit with a known time decay that may be used to generate pulses that are used as time stamp indicators for data collected in memory 160.

Also shown is an optional high accuracy clock 180 that provides for high accuracy time stamps. Optional high-power, high-accuracy clock 180 may be incorporated as there might be times during the data collection period where superior accuracy in time measurement is deemed critical, e.g. during the time-out period of the occupancy sensor. Therefore, the inclusion of a more accurate clock allows for the possibility of turning the clock on for a short period of time. However, this can possibly introduce another error due to any handoff error while switching from the high-accuracy clock to the low-accuracy clock or from the low-accuracy clock to the high-accuracy clock. Thus, allowing for estimating of two different clock skews, one for the time when the low-power clock is on and one for the time when the high-power clock is also considered, when the optional high-accuracy clock in included.

Although the portable device 100 is shown including a high-accuracy clock 180, it would be appreciated that a high-accuracy clock signal may be provide by a remote source. For example, portable device 100 may include circuit that allows portable device 100 to communicate with a cellular network or a satellite network (e.g. GPS) to obtain a high accuracy time value.

Also shown is a power source 185 that is used to provide power to the illustrated components within portable device 100. Although the power source is shown as a battery, it would be appreciated that the power source may be a standard electrical supply providing an Alternating Current to the device 100, which then AC-DC rectified in order to supply a DC voltage to the illustrated components.

FIG. 1 further illustrates a processing algorithm block 190 that may receive the raw data collected and stored in memory 160. Processing algorithm shown in block 190 may be performed within portable device 100 (i.e., processor 150) or may be performed in a device remote to portable device 100. For example, in the former case, the portable device 100 may collect data for a known period of time (e.g., a week, a month, etc.) and then process the collected data to determine statistics that may be used to assist in determining energy usage, for example. After the statistics are determined, then the results may be provided to a second processing system (e.g., a standalone computer 193, tablet 196, smart phone 198, etc.) through a wired or wireless connection (not shown). The memory may then be cleared and the collection process is continued. In this exemplary embodiment of the invention, the amount of memory that is required for data collection is minimized. Alternatively, the raw data may be downloaded from device 100, through a wired connection (direct and/or networked) or wireless connection (direct and/or network), to a remote device (not shown), as previously discussed. The raw data may then be processed outside of portable device. In one aspect of the invention, an indication may be provided to a user to indicate that a specific time period has expired or that the memory is full. Thus, after the raw data is download-ed to the remote device (193, 196, 198) the memory 160 may be cleared and the collection process continues.

FIG. 1, also illustrates a display 195 that may be used to display the raw and/or the processed data to determine energy consumption.

Thus, in accordance the exemplary embodiment shown in FIG. 1, the present invention includes:

a data collection phase wherein a portable device (such as a data logger) may be installed in individual rooms and/or indoor spaces. For each time-step, data is collected for each sensor that portable device is connected to. In addition, if the high-accuracy clock is incorporated (or information regarding a high-accuracy clock is received), the portable device determines whether a superior time accuracy is required. Accordingly, the processor 150 selects the appropriate clock; high power clock during time periods requiring superior accuracy, and low-power clock otherwise to save battery power. The combination of the selected clock and a variety of energy-related sensors collect data that eventually flows into memory 160 (i.e., a database). After the end of the logging period, the data collection block ends; and a time skew correction phase, to determine a time skew that may have occurred using the low accuracy clock. An example of a sequence of sub-processes within an estimation process may include a data cleaning phase, an approximate skew correction based on patterns within a known period of time, a data pre-processing to identify the time blocks and an accurate skew correction based on known patterns (e.g., time and occupancy).

Data Cleaning:

Data collected from loggers can contain several anomalies (e.g., very short occupancy periods often indicate false positives or other heat sources in the room can cause a false positive). In such cases, the data will contain short occupancy periods equal to or slightly longer than the time-out period. These short periods (or false positives) may be removed to avoid estimation errors.

Approximate skew correction based on known time patterns: An approximate skew identification based on a time (e.g., daily, weekly, monthly, etc.) and/or occupancy patterns can be employed to identify a correct day for each logged entry. This can be achieved, for example, using an optimization problem where the only decision variable is the clock skew and the objective is to minimize the amount of time the room was occupied during weekends and public holidays.

Data Pre-processing: There is a lot of valuable information in the cyclical patterns of people's workdays. That is, there is a lot of useful information in their start and end times. However, the task of identifying the work-day blocks, i.e. identifying which of the logged data entries represents the first entry time and the last exit time of the person(s) occupying an indoor space, is not trivial. Thus, the logged data is pre-processed, which involves identification of workday blocks, assignment of each block to an actual day etc. Identification of the work-day block in itself can involve a number of criteria and filters, such as exclusion of workdays with very short total occupancy time in a block (e.g. 60 minutes), or very short maximum continuous occupancy time in a block (e.g. 150 minutes), or) very long total duration of a block (e.g. more than 18 hours), 4) very short total duration between two consecutive blocks (e.g. less than 10 hours), etc.

Accurate Skew Correction based on Daily Patterns: This step of the skew correction process uses pre-generated work-day blocks and pre-identified day corresponding to each block to match actual start and end times of each block to the data logged. In this case, the actual block start and end times can be considered functions of typical start and end times of the day at an office (such as 8 am to 5 pm, for example), personal biases (some people like to start/end their work day earlier/later than others) and daily biases (on some days everyone starts/ends day somewhat earlier/later than usual), etc.

Figure 2:
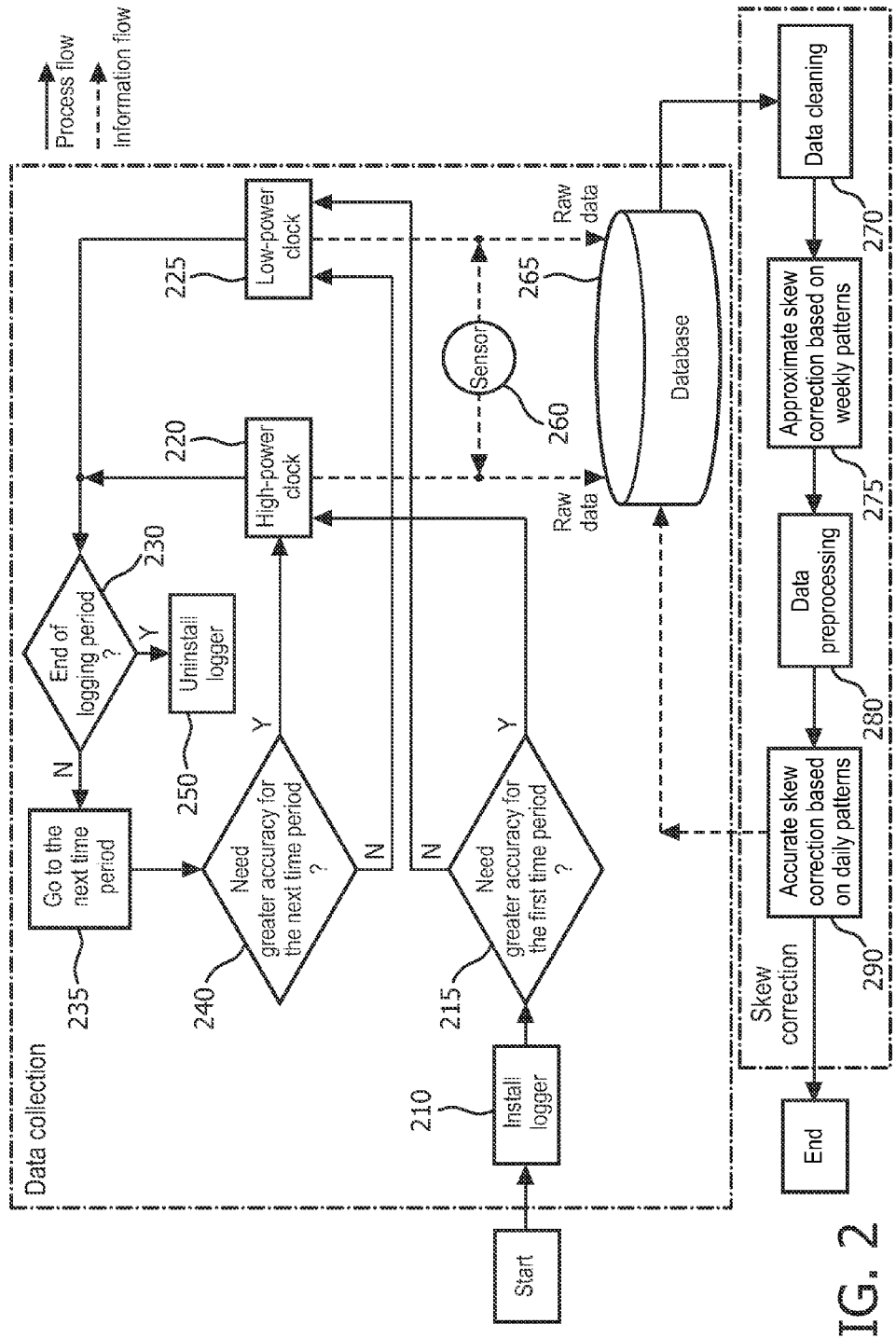
FIG. 2 illustrates a flow chart of an exemplary processing in accordance with the principles of the invention.

FIG. 2 illustrates a flow chart of an exemplary processing in accordance with the principles of the invention.

Referring to FIG. 2, upon entry to the processing a portable device is installed (e.g., located and powered-on) at block 210. At block 215 a determination is made whether a high accuracy time signal is necessary. If yes, then processing continues to block 220, where a high accuracy time stamp signal is obtained, if the optional high accuracy clock is included, as previously discussed.

A determination is made whether a logging period has ended at block 230. If so, then the electronic device is uninstalled and the data processed as previously described. That is, the raw data may be processed within the device and the results downloaded or the raw data is downloaded into a remote device and processed.

However, if the logging period is not ended, then a next period is obtained at block 235. At block 240, a determination is made whether a high accuracy time is again needed.

If so, then processing continues to block 220 to obtain a high accuracy clock time stamp. However, if a high accuracy clock time stamp is not necessary, the processing continues to block 225 to obtain a low power clock stamp. Processing continues at block 230 to determine whether the logging period has ended. Time values associated with the high accuracy clock may be collected on a periodic basis, for example. Other criteria for collection of high accuracy clock data may, for example, be based on an occurrence of an unscheduled event. In conjunction, with the determination of the high and/or low accuracy time stamps, data from sensors 260 (i.e., 120, 13, 140, FIG. 1) is collected and stored in a data base 265 (e.g., memory 160).

After data logging is completed, then the skew correction processing begins on the collected data, wherein the raw data is processed through the data cleaning step 270, the approximate sew correction step 275, the data preprocessing step 280 and the accurate screw correction processing step. The processed data may be stored in the data base, downloaded to a remote device (e.g., 193, FIG. 1) and/or displayed on a display (190, FIG. 1).

Figure 3A:
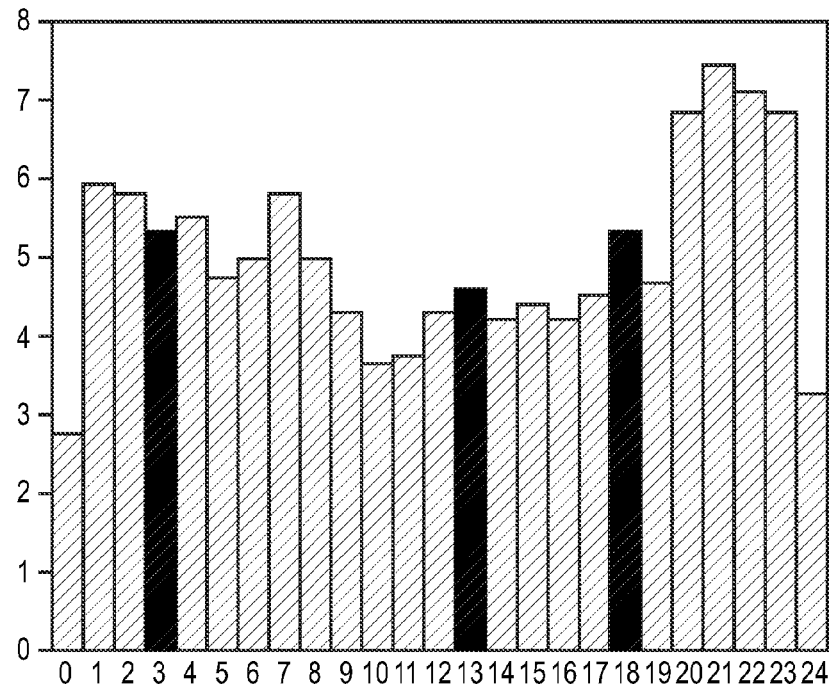
FIGS. 3A and 3B illustrate an exemplary collection of raw data using a low-accuracy clock in a portable device shown in FIG. 1.
Figure 3B:
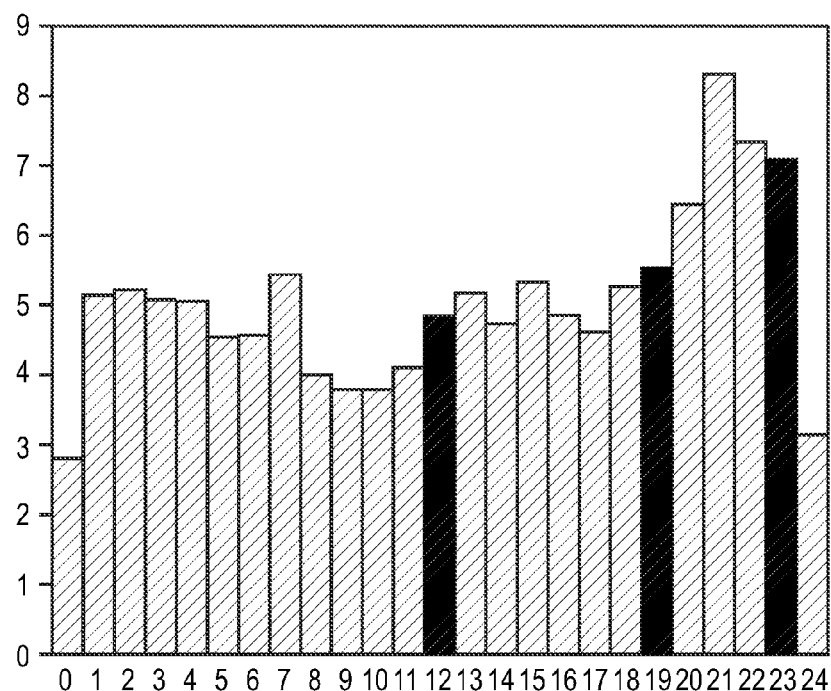

FIGS. 3A and 3B illustrate collected raw data values for occupancy (as determined by an occupancy sensor) during a day using a low accuracy clock for a plurality of areas, each being monitored by a corresponding portable device 100.

FIG. 3A illustrates a number of times occupancy within an area is changed from 0 to 1 (no occupancy to occupancy) during each hour of a day using a low accuracy clock and FIG. 3B shows a number of times occupancy changes from 1 to 0 (occupancy to no occupancy) during each hour of the day using a low accuracy clock. FIGS. 3A and 3B are generated using raw data prior to any skew correction being applied. As shown in FIGS. 3A and 3B, the occupancy change times are seemingly arbitrarily distributed in the raw data as the error in the low-accuracy clock has an accumulated error. Hence, useful information regarding occupancy (and consequential, energy consumption) cannot be directly extracted from this raw data.

Figure 4A:
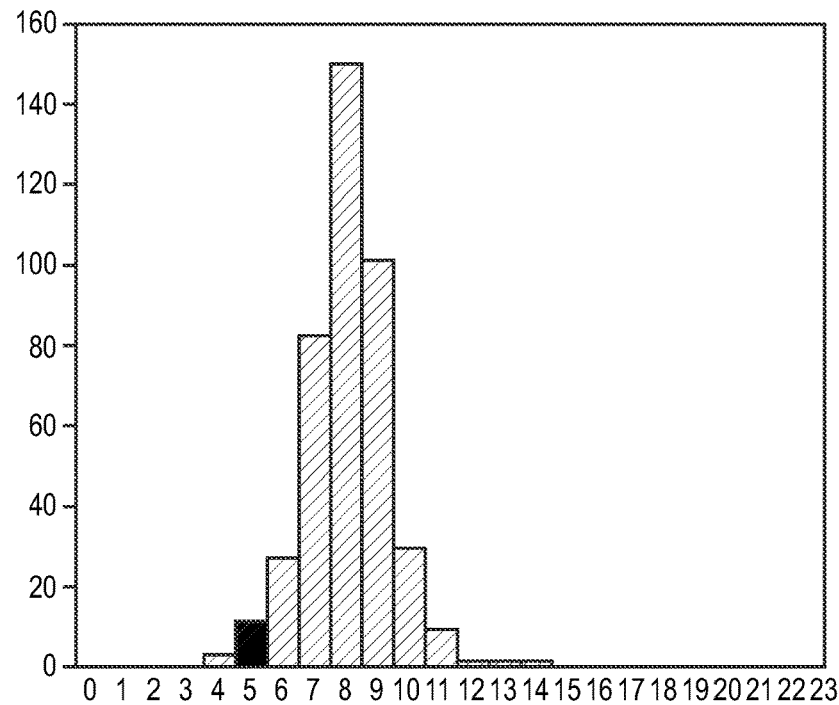
FIGS. 4A and 4B illustrate an example of time-corrected data of FIGS. 3A and 3B, respectively, in accordance with the principles of the invention.
Figure 4B:
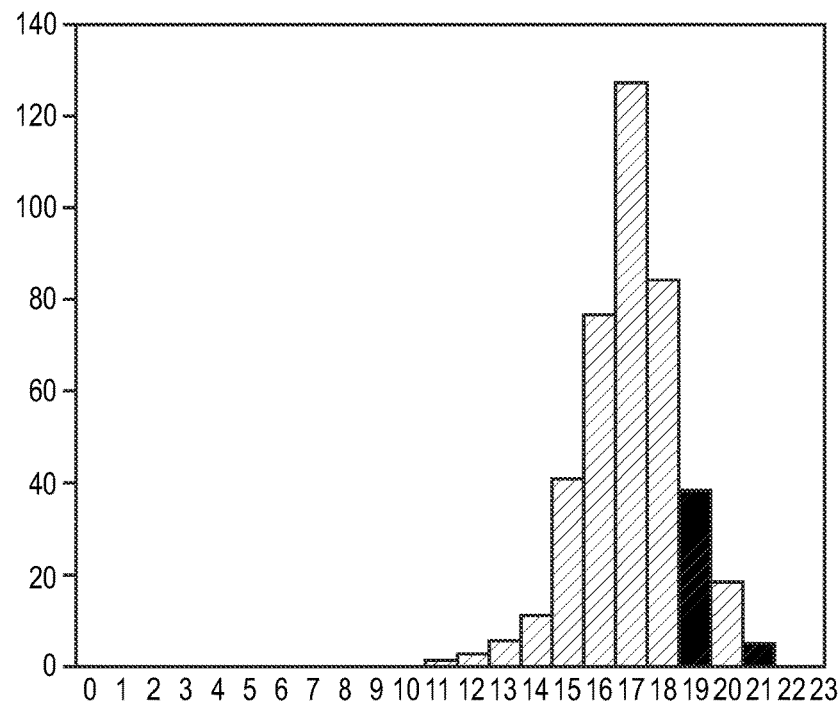

FIGS. 4A and 4B show the output of the skew correction process for the data shown in FIGS. 3A and 3B, respectively. FIG. 4A shows the distribution of the work-day start times and FIG. 4B shows the distribution of work-day end times against hour of the day. As shown in FIGS. 4A and 4B, there are clear peaks in work-day start and end times at hours which correspond to reasonable start and end times for work-day blocks. FIGS. 4A and 4B demonstrate that the data after clock skew correction shows a dramatic improvement in the accuracy of time-stamp measurement for accurate occupancy data logging using a low-power clock.

Returning to FIG. 1, the skew correction algorithm 190 may be viewed as a black box, with the following inputs and outputs:

Input: $[\tau_{tn}, o_{tn}]_{t \in \{1 \ldots T\}, n \in \{1 \ldots N\}}$
where,
T: Number of data entries with an occupancy-related event. That is, occupancy changing from UNOCUPIED to OCCUPIED (0 to 1) or vice versa (occupancy information, change in occupancy information);
N: Number of loggers;
$\tau_{tn}$=Measured time corresponding to the $t^{th}$ data entry for $n^{th}$ logger;
$o_{tn}$=Occupancy value immediately after the occupancy transition, $\in \{0, 1\}$, corresponding to the $t^{th}$ data entry for $n^{th}$ logger.

Output: $[\widehat{b_{n,ma}}, \widehat{b_{n,la}}]_{n \in \{1 \ldots N\}}$
where, $\widehat{b_{n,ma}}$: Estimate of clock drift for logger device n, when using the more accurate clock, $\widehat{b_{n,la}}$: Estimate of clock drift for logger device n, when using the less accurate clock.

The skew or drift of a clock is defined as the multiplicative constant which when multiplied with the true length of a time-period gives the corresponding time duration as measured by that clock. Therefore, the problem of estimation of the skew or drift of a single clock involves estimation of two such multiplicative constants, $\widehat{b_{n,ma}}$ for the time when the more accurate clock (e.g. a quartz crystal clock with high-power consumption) is used, and $\widehat{b_{n,la}}$, when the less accurate clock (e.g. an RC clock with low-power consumption) is used. Typically there are multiple data loggers installed at a commercial site (often with one logger per room being monitored).

Therefore, the overall problem is of estimating two drift rates per logger, i.e. $[\widehat{b_{n,ma}}, \widehat{b_{n,la}}]_{n \in \{1 \ldots N\}}$.

Thus, in accordance with the principles of the invention, the estimation process uses the fact that people have some patterns to their occupancy behavior. There are two major trends of importance. First, people tend to spend more time in their offices/workplace during weekdays than during weekend days. Second, people spend more time in their workplace during weekdays than weeknights. The first observation exploits weekly occupancy behavior patterns while the second exploits daily occupancy behavior patterns.

A mathematical model of the accurate skew estimation may be further represented as:

$\{1 \ldots N\}$: Set of rooms with sensors
$\{1 \ldots D\}$: Set of days in the dataset
$[x_{dn}]_{d \in \{1 \ldots D\}, n \in \{1 \ldots N\}}$: Workday start times
$[y_{dn}]_{d \in \{1 \ldots D\}, n \in \{1 \ldots N\}}$: Workday end times
$[\tilde{x}_{dn}]_{d \in \{1 \ldots D\}, n \in \{1 \ldots N\}}$: Logged workday start times
$[\tilde{y}_{dn}]_{d \in \{1 \ldots D\}, n \in \{1 \ldots N\}}$: Logged workday end times
$[b_{n,occ}]_{n \in \{1 \ldots N\}}$: Clock drift when OCCUPIED
$[b_{n,unocc}]_{n \in \{1 \ldots N\}}$: Clock drift when UNOCCUPIED Clock drift is defined as a multiplicative factor that modifies the time measured by the device. A factor >1 (<1) means that the measured time moves faster (slower) than actual time by that factor.

$$a_{n,occ} = \frac{1}{b_{n,occ}} \text{ and } a_{n,unocc} = \frac{1}{b_{n,unocc}}$$

are the inverses of the clock drift.

In addition, there might be some day specific factors that might affect every room's occupants' schedules similarly, e.g. all rooms' occupants might want to leave earlier than usual on a Friday, or arrive later than usual on a Monday, or leave specifically early on the Wednesday before thanksgiving in the U.S., etc. This is referred to as a daily additive bias, which is constant across all rooms.

$[p'_d]_{d \in \{1 \ldots D\}}$: Daily additive bias in workday start times; and $[q'_d]_{d \in \{1 \ldots D\}}$: Daily additive bias in workday end times.

Furthermore, there could be some individual specific factors, e.g. some individuals have a tendency to work until late and, hence, stay longer in the office than others. These factors affect the schedule of an individual room's occupants in a similar way every day. These may be represented as an additive personal bias.

$[r'_n]_{n \in \{1 \ldots N\}}$: Personal additive bias in workday start times.

$[s'_n]_{n \in \{1 \ldots N\}}$: Personal additive bias in workday end times.

Under this general model, the workday start and end time for room n on day d is as follows.

$$x_{dn} = \bar{x}_{dn} + p'_d + r'_n + \epsilon'_{dn}.$$

$$y_{dn} = \bar{y}_{dn} + q'_d + s'_n + \gamma'_{dn}.$$

where $\bar{x}_{dn}$ and $\bar{y}_{dn}$ are the standard values of workday start and end times on each day, e.g. 8 am and 5 pm respectively.

$\epsilon'_{dn}$ and $\gamma'_{dn}$ are errors. It is further assumed, for example, that each error term is independent and identically, normally distributed.

Let $f_{dn}$ and $g_{dn}$ be the fraction of measured time the $n^{th}$ room is occupied until start and end time of $d^{th}$ work-day respectively. Let $$b_{n,s} = \frac{\tilde{x}_{dn}}{x_{dn}} \text{ and } b_{n,e} = \frac{\tilde{y}_{dn}}{y_{dn}}.$$

Therefore, $$\frac{1}{b_{n,s}} = a_{n,occ} * f_{dn} + a_{n,unocc} * (1 - f_{dn}), \text{ and}$$

$$\frac{1}{b_{n,e}} = a_{n,occ} * g_{dn} + a_{n,unocc} * (1 - g_{dn}).$$

The measured values of these start times and end times are as follow:

$$\tilde{x}_{dn} = x_{dn} = b_n \bar{x}_{dn} + b_n p'_d + b_n r'_n + b_n \epsilon'_{dn}$$

$$\bar{x}_{dn} = (a_{n,occ} * f_{dn} + a_{n,unocc} * (1-f_{dn})) \tilde{x}_{dn} - p'_d - r'_n - \epsilon'_{dn} = a_n \tilde{x}_{dn} + p_d + r_n + \epsilon_{dn},$$

where, $\epsilon_{dn} = -\epsilon'_{dn}, p_d = -p'_d,$ and $r_n = -r'_n;$ $$\tilde{y}_{dn} = b_n y_{dn} = b_n \bar{y}_{dn} + b_n q'_d + b_n s'_n + b_n \gamma'_{dn}$$

$\Rightarrow$ $$\bar{y}_{dn} = (a_{n,occ} * g_{dn} + a_{n,unocc} * (1-g_{dn})) \tilde{y}_{dn} - q'_d - s'_n \gamma'_{dn} = a_n \tilde{y}_{dn} + q_d + s_n + \gamma_{dn},$$

where, $\gamma_{dn} = -\gamma'_{dn}, q_d = -q'_d$ and $s_n = -s'_n.$

So the overall model is as follows:

$$\tilde{x}_{dn} = a_{n,occ} * f_{dn} * \tilde{x}_{dn} + a_{n,unocc} * (1-f_{dn}) * \tilde{x}_{dn} + p_d + r_n + \epsilon_{dn} \forall d \in \{1 \ldots D\}, n \in \{1 \ldots N\}, \quad (1); \text{ and}$$

$$\tilde{y}_{dn} = a_{n,occ} * g_{dn} * \tilde{y}_{dn} + a_{n,unocc} * (1-g_{dn}) * \tilde{y}_{dn} + q_d + s_n + \gamma_{dn} \forall d \in \{1 \ldots D\}, n \in \{1 \ldots N\} \quad (2)$$

In this case, the values of $\tilde{x}_{dn}, \tilde{y}_{dn}, f_{dn}$ and $g_{dn}$ are assumed to be known (measured) and the values of $\bar{x}_{dn}$ and $\bar{y}_{dn}$ can also be ascertained based on our knowledge of the typical working hours. In another aspect of the invention, the user may provide the typical working hours of the office as one of a user provided input in order to obtain more accurate estimation results.

Thus, in accordance with the principles of the invention, the parameters to be estimated are, $a_{n,occ}, a_{n,unocc} \forall n \in \{1 \ldots N\}, p_d \forall d \in \{1 \ldots D\}, r_n \forall n \in \{1 \ldots N\}, q_d \forall d \in \{1 \ldots D\},$ and $s_n \forall n \in \{1 \ldots N\}$ in the most general case.

Figure 5:
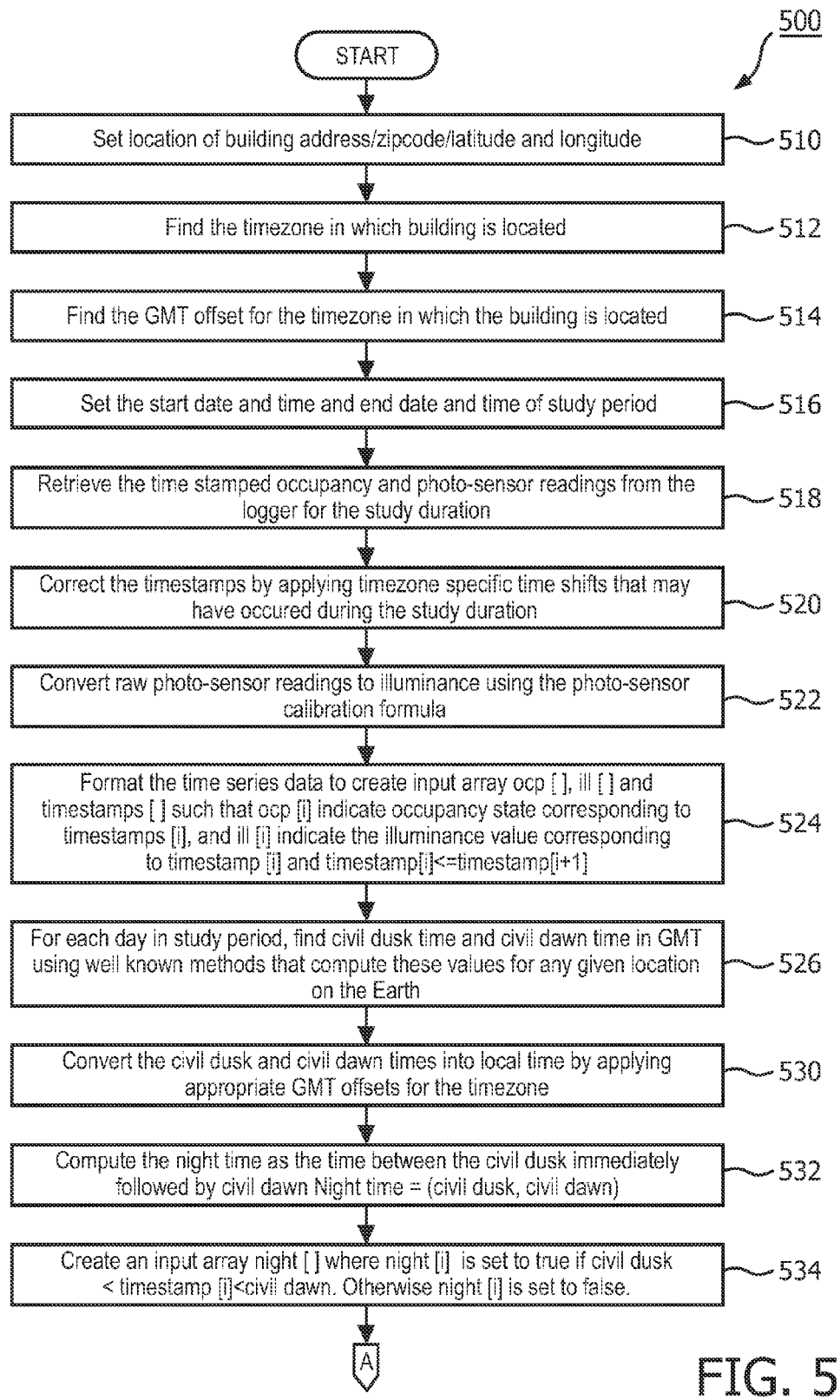
FIG. 5 illustrates a flow chart of an exemplary process in accordance with the principles of the invention.
Figure 5:
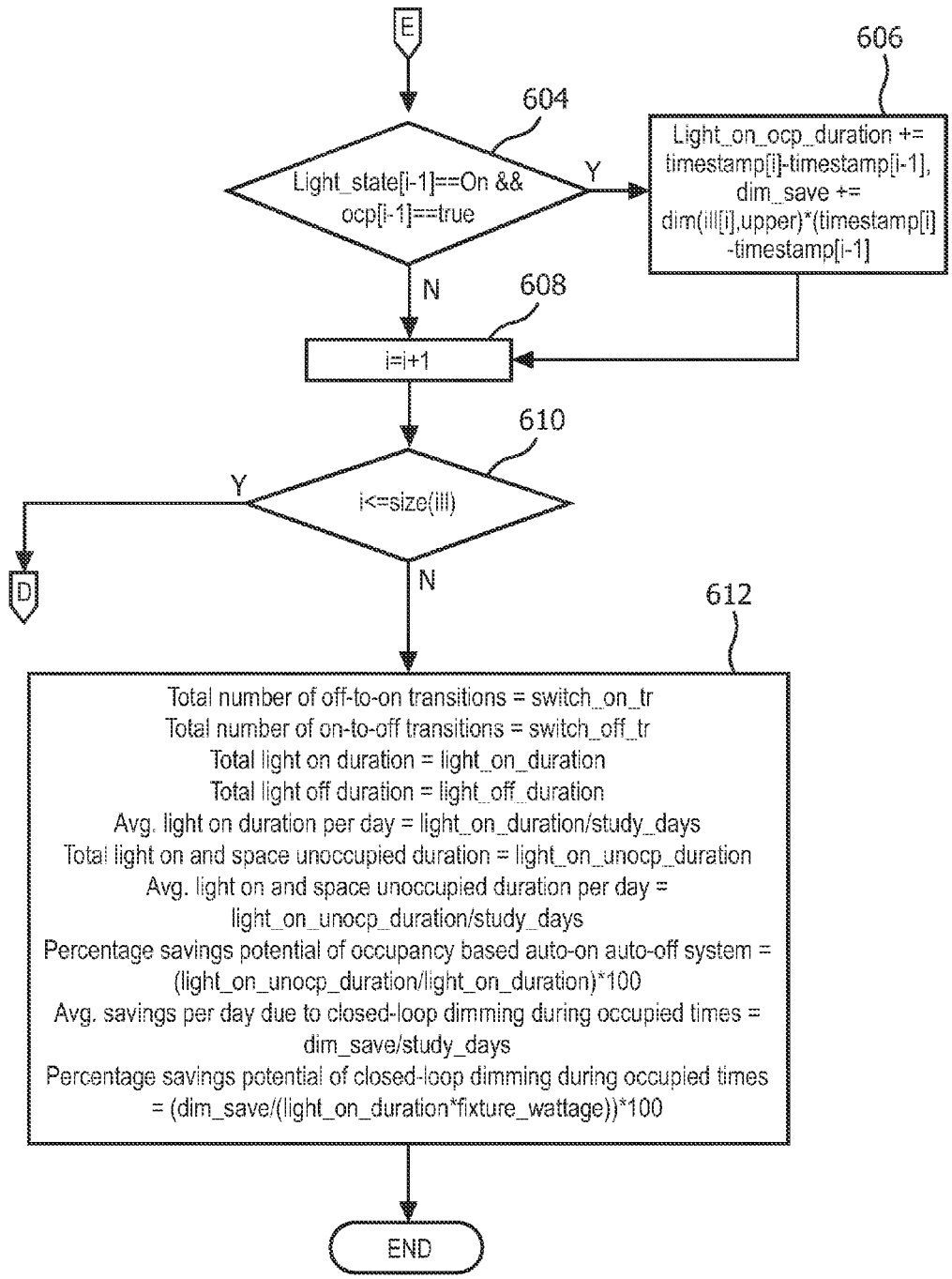
Figure 6:
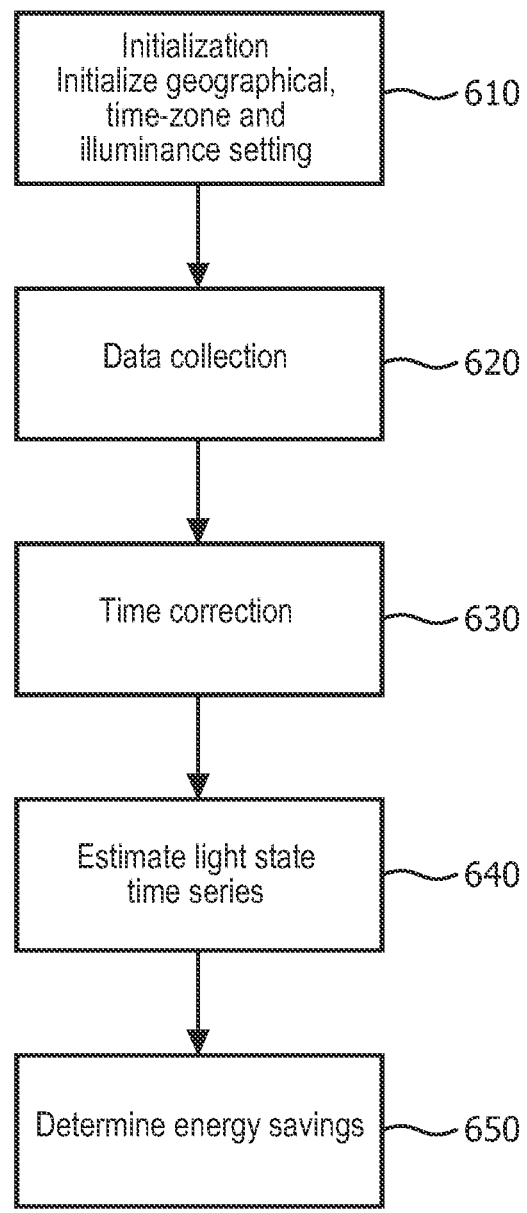
FIG. 6 illustrates a flow chart of an exemplary process in accordance with the principles of the invention.

FIGS. 5 and 6 illustrate flow charts of processing in accordance with the principles of the invention, wherein FIG. 5 represents a comprehensive flow chart of the processing for collecting and processing data in accordance with the principles of the invention and FIG. 6 represents a high-level flow chart of the processing for collecting and processing data in accordance with the principles of the invention.

With reference to FIG. 6, an initialization of the system or device described herein is shown at block 610. Detailed processing of the initialization of the data logging system or device is shown with regard to blocks 510-534 in FIG. 5. At block 620, data is collected in accordance with the principles of the invention. At block 630 a time correction of the data collected is performed. Detailed processing of the time correction is shown with regard to FIG. 2. At block 640, an estimate to the light state of the area monitored by the data logging system or device is performed. Details of the processing for determination of the light state estimation are shown with regard to blocks 536-582 of FIG. 5. At block 640, a determination of an energy savings is performed. Details of the processing for the determination of energy savings are shown with regard to blocks 584-612 of FIG. 5.

In accordance with the processing shown in FIG. 5, a portable data logger, as presented herein, may be utilized to collect data in order to determine energy usage, for example, over a known period of time. It would be appreciated that one or more steps shown in FIG. 5 may be excluded without altering the scope of the invention.

With reference to FIG. 5, at block 510, the location of the area in which the data logger may be positioned is determined. This can be done in many ways. For example, the user can specify the full address, zip-code of the building. There exist software tools that can map the address/zip code to a latitude and a longitude. Alternatively, the user can specify the latitude and longitude of the building or the latitude and longitude may be determined from a GPS system, for example. From the location of the building, a time zone in which the building is located may be determined, at block 512. At block 514, the Greenwich Meridian time (GMT) is obtained and used as a reference time. It would be appreciated that location local time may also be obtained and used in this process. At block 516, the start date and time may be represented as Greenwich Meridian Time (GMT). It would be appreciated that the time may also be set as local time without altering the scope of the invention. At block 518, the data collected in the data logger may be collected and time-stamped. At block 520, the collected timestamp data is corrected, by applying time zone specific time shifts that may have occurred during the study duration, and as previously discussed. At block 522, the raw photosensor readings are converted to illuminance, assuming that the data logged is associated with energy usage. It would be appreciated that the data collected may be other types of data and that the conversion of the collected data to appropriate terms would be dependent upon the type of data that is collected. At block 524, the processed data is format-ed and sorted in a time series illuminance and occupancy data in ascending order of timestamps. At block 526, for each day in the study period (e.g., a predetermined time period), a civil dusk time (i.e., a time at which the sun is 6 degrees below the horizon in the evening) and a civil dawn time (i.e., a time at which the sun is 6 degrees below the horizon in the morning) in GMT is obtained. At block 530, the civil dusk and dawn times are converted into local time by applying appropriate GMT offsets for the time zone in which the building is located. At block 532, a night time (e.g. when daylight is absent) is determined as the time between the civil dusk and subsequent civil dawn. (i.e., Night time=(civil dusk, civil dawn). At block 534, an array is created wherein each occupancy and illuminance data record to indicate whether it belongs to night time or not.

Beginning at block 536 and extending to block 544, each of the entries in the array is processed to determine whether the entry is within a night time region or a day time region. At block 536, a determination is made of an absolute value of the change in illuminance recorded at night throughout the study period as $$\text{abs\_diff}[i-1] = |\text{ill}[i] - \text{ill}[i-1]|$$

for all samples i and i−1 such that timestamp[i] and timestamp[i−1] belong to a night time period
where ill: illuminance,
timestamp: time in year, month, day, hour, minute and seconds, and
[i] indicates the $i^{th}$ observation.

At block 546, clustering techniques, such as agglomerative clustering (for example, SLINK for single-linkage and CLINK for complete-linkage clustering) are applied to group the abs_diff values into two clusters, which are referred to, herein, as cluster A and cluster B.

At block 548, a determination of mean (or average) values of clusters A and cluster B is made.

At block 550 a determination is made with regard to clusters A and B. If the mean value of cluster A is higher than the mean value of cluster B then cluster A is referred to as a reference cluster at block 554. Otherwise, cluster B is referred to as the reference cluster at block 552. At block 556, a determination is made regarding upper and lower limit values for the reference cluster. In one exemplary example, the upper and lower limits may be determine such that greater than 97% of the entries within the reference cluster fall in the range defined by upper limit and lower limit. It would be appreciated that the value to which upper and lower are determined may be changed without altering the scope of the invention.

At block 558, preset information regarding the study period (e.g., number of days, staring day and time, ending day and time, etc.) and information regarding the lighting within the area of the data collection (e.g., fixture wattage in each area, etc.) are input. At block 560, the inputted information and collected data are collected in a single array or data base.

At blocks 562-582, a determination is made from the collected data whether a light fixture is in one of an on-state or an off-state.

At block 562, variables in the determination process are initialized. At block 564, a change in illuminance for the samples throughout the study period is determined as;

$$\text{diff}[i-1] = \text{ill}[i] - \text{ill}[i-1] \text{ for all } i \text{ in study period.}$$

If lower limit is less than or equal to diff[i−1], which is less than or equal to the upper limit (block 566) then the light_state[i] is set to on (block 568).

If lower limit is less than or equal to −diff[i−1] is less than or equal to upper limit (block 570) then the light_state[i] set to off (block 572).

At block 574 a determination is made whether light_state [i−1] is estimated to be off and ill[i] during night time (i.e., true) is higher than lower limit. If so then the light_state[i] is set to on. (block 576).

In this case, the night[i] is true if the corresponding timestamp[i] belongs to night status.

At lock 578, a determination is made whether light_state [i−1] is estimated to be on and the ill[i] falls below the lower limit. In case, the light_state[i] to off. (block 580).

Otherwise, the light_state[i] is set to a previous light state (light_state [i−1]) at block 582.

Blocks 584 through 608 describe a process for determining characteristics of the data collected during the collection period.

For example, at block 586, a duration of light off time may be determined as a difference between successive time stamps. At block 590 a light on time may be determined as a difference between successive time stamps. At block 594, a transition to an on time may be determined. At block 598, a transition to an off time may be determined. At block 602 a light on in an unoccupied area duration may be determined. At block 606 a light on in an occupied area with a dimming feature may be determined.

From the determined light on-light off times, a transition time duration may be used to determine characteristics that may be used to determine potential energy savings.

Block 612, describes an number of different conditions that may be determined in order to determine potential energy savings. For example, from detected and or determined switch-on and switch-off events, a total number of off-to-on transitions duration during the study period may be determined. For example, an average number of off-to-on transitions per day/weekday/weekend. Also a total number of on-to-off transitions during the study period may be computed. In another aspect of the invention, from the detected switch-on and switch-off events and corresponding timestamps, a duration between a switch-on and subsequent switch-off event may be determined. For example, a sum of all the durations when light was detected to be on may be used to determine a total duration when the light was on during the entire study period. In another aspect of the invention, based on a total number of days in the study period, an average duration per day when a light was on may be determined. In this case, a percentage ratio of a total light on duration to a total study duration may be determined. Similarly, a total duration when light was detected to be off to a total study time may be determined. Thus, a percentage ratio of total light off duration to total study duration may be determined. In another aspect of the invention, from the timestamp-ed occupancy data and timestamp-ed light state estimation data, a total duration when light was detected to be on and a space was found to be unoccupied, a determination of time periods during which the lights are inadvertently left on may be made. Another aspect of the invention, from the timestamp-ed occupancy data and the timestamp-ed light state estimation data, a percentage ratio of light switched-on and space unoccupied durations to total light on durations may be determined. This percentage indicates a savings potential for occupancy sensing based system relative to current lighting usage durations. In another aspect of the invention, a percentage ratio of light switched-on and space unoccupied durations on weekday/weekend to total light on durations on weekday/weekend, respectively may be determined. In this case, an average light switched-on and space unoccupied duration per day can be derived.

In another aspect of the invention, in which a closed-loop dimming system starts dimming the artificial lights if illuminance measured by the photo-sensor exceeds a predefined threshold (i.e., day light harvesting), a savings potential of closed-loop dimming, which is presented herein as a function dim(ill, threshold) may determine an expected savings due to dimming for a given illuminance and a threshold. In this case, the function f(ill) maps illuminance reading to power consumed by light fixture as:

$$\text{dim}(ill[i], \text{threshold}) = \begin{cases} f(\text{threshold}), & ill[i] > 2*\text{threshold} \\ f(0) & ill[i] < \text{threshold} \\ f(ill[i]) - f(\text{threshold}), & \text{otherwise} \end{cases}$$

The function dim(ill, threshold) computes power savings. The energy saving potential for closed-loop dimming is estimated as follows.

$$\text{dim\_save} = \sum_{i: light\_state[i-1]==On \wedge ocp[i-1]==true} \text{dim}(ill[i], \text{threshold})$$

$$(\text{timestamp}[i] - \text{timestamp}[i-1])$$

In another aspect of the invention, a percentage ratio of closed-loop dimming savings to energy consumed during light on durations may be determined. In this case, an average savings per day due to closed-loop dimming during occupied times may be determined.

In another aspect of the invention, if the area or space being monitored is known then a person skilled in art can easily translate the above results into per square foot values.

Although the present invention has been described with regard to portable device suitable for collecting sensor data over a sufficient period of time in order to determine energy savings with regard to luminance and occupancy, it would be appreciated that potential energy saving may be determined with regard to heating, for example, without altering the scope of the invention.

The above-described methods according to the present invention can be implemented in hardware, firmware or as software or computer code that can be stored in a recording medium such as a CD ROM, an RAM, a floppy disk, a hard disk, or a magneto-optical disk or computer code downloaded over a network originally stored on a remote recording medium or a non-transitory machine readable medium and to be stored on a local recording medium, so that the methods described herein can be rendered in such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein.

Although, a computer, a processor and/or dedicated hardware/software are described herein as being capable of processing the processing described herein, it would be recognized that a computer, a processor and/or dedicated hardware/software are well-known elements in the art of signal processing and, thus, a detailed description of the elements of the processor need not provided in order for one skilled in the art to practice the invention described, herein.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage.

The term "comprises", "comprising", "includes", "including", "as", "having", or any other variation thereof, are intended to cover non-exclusive inclusions. For example, a process, method, article or apparatus that comprises a list of elements is not necessarily limited to only those elements but may include other elements not expressly listed or inherent to such process, method, article, or apparatus. In addition, unless expressly stated to the contrary, the term "or" refers to an inclusive "or" and not to an exclusive "or". For example, a condition A or B is satisfied by any one of the following: A is true (or present) and B is false (or not present); A is false (or not present) and B is true (or present); and both A and B are true (or present).

While there has been shown, described, and pointed out fundamental and novel features of the present invention as applied to preferred embodiments thereof, it will be understood that various omissions and substitutions and changes in the apparatus described, in the form and details of the devices disclosed, and in their operation, may be made by those skilled in the art without departing from the spirit of the present invention.

For example, it would be appreciated that time correction may be performed as data from the plurality of sensors is collected, wherein known patterns of time usage and occupancy may be known and used in the time correction process. Or the time correction may be performed after the data collection period has expired, wherein patterns of time usage and occupancy may be applied to the collected data. Similarly, the collected data may be transmitted to a remote site and/or displayed with and/or without time correction as the data is being collected or after the data collection period has expired.

It is expressly intended that all combinations of those elements that perform substantially the same function in substantially the same way to achieve the same results are within the scope of the invention. Substitutions of elements from one described embodiment to another are also fully intended and contemplated.

Any reference signs in the claims should not be construed as limiting the scope of the claims or the invention described by the subject matter claimed.

What is claimed is:

1. A portable system for logging sensor data and creating energy consumption patterns in an area comprising:
    a low-power and/or low accuracy clock; and
    a processor in communication with a memory, the processor;
        receiving data items from each of a plurality of sensors;
        associating a time stamp generated by the low-power and/or low accuracy clock with each data item received from each of the plurality of sensors;
        storing the received data items for a predetermined period of time; and
        processing the stored data items to determine a high accuracy clock time stamp for each of the stored data items, wherein determining said high accuracy clock time stamp comprises:
        determining a time usage pattern of the area during a period of receiving the data items;

approximating a correction of the time-stamp associated with the low-power and/or low accuracy clock based on the time usage pattern;
determining an occupancy pattern during a period of receiving the data items;
refining the correction based on the occupancy pattern associated with a second known time usage pattern; and
applying the correction to the time-stamp associated with the low-power and/or low accuracy of the stored data.

2. The portable system of claim 1, further comprising: a high-power and/or high accuracy clock.

3. The portable system of claim 2, wherein the processor further:
obtaining at least one time sample from the high-power and/or high accuracy clock during the predetermined period of time; and
storing the at least one time sample from the high-power and/or high accuracy clock.

4. The portable system of claim 3, wherein the at least one time sample from the high power and/or high accuracy clock is obtained on a periodic basis.

5. The portable system of claim 1, wherein the step of processing the stored data further comprises:
transmitting the stored data items to a remote site.

6. The portable system of claim 1, wherein the step of processing the stored data items is performed after the predetermined period of time expires.

7. The portable system of claim 1, the step of processing the stored data items is performed during the predetermined period of time.

8. The portable system of claim 1, further comprising: a display displaying the stored data items.

9. The portable system of claim 1, further comprising: at least one of the plurality of the sensors.

10. The portable system of claim 1, further comprising: a communication port for receiving the data items from at least one of the plurality of sensors.

11. The portable system of claim 1, wherein the processing further comprising:
determining at least one period of time in which a light is at least one of a state of: on and off;
determining at least one period of time in which the area is in a state of at least one of: occupied and unoccupied;
determining an average value for each of at least one period of time in which a light is in the state of on and at least one period of time in which the area is in the state of unoccupied;
determining an energy savings using an automatic light operation based on the average values; and
storing the determined values.

12. The portable system of claim 11, wherein the processing further comprising:
determining an average energy savings using a closed-loop dimming system during the at least one period of occupancy of the area; and
determining a percentage energy savings using the closed-loop dimming system; and
storing the determined values.

13. A portable data logging device comprising:
means for receiving inputs from at least one of a plurality of devices:
a low-power and/or low accuracy clock;
a processor in communication with a memory, the processor:
receiving at least one input from the at least one of a plurality of devices;
associating a time-stamp from the low-power and/or low accuracy clock with each of the at least one input from the at least one of a plurality of devices;
storing the at least one input and associated time-stamp for a predetermined time;
generating a correction value of each of the low-power and/or low accuracy clock time-stamp after the predetermined time has expired;
applying the correction value to each of the low-power and/or low accuracy clock time-stamp, the correction being based on predetermined time and occupancy patterns,
processing the time-stamp corrected stored inputs to determine energy patterns within the stored at least one input;
determining at least one period of time in which a light is at least one of: on and off;
determining at least one period of time in which the area is in a state of at least one of: occupied and unoccupied;
determining an average value for each of at least one period of time in which a light on and at least on period of time in which the area is unoccupied;
determining an energy savings using an automatic light operation from the average values; and
storing the determined values.

14. The portable device of claim 13, further comprising: determining an energy savings using a closed loop dimming system.

15. The portable device of claim 14, further comprising: a display displaying the stored data.

16. The portable device of claim 14, further comprising: at least one of the plurality of devices.

17. The portable device of claim 14, further comprising: means for transmitting the at least one of the stored at least one input and the determined values.

18. A portable system for logging sensor data and creating energy consumption patterns in an area comprising:
a data collection device comprising:
a low-power and/or low accuracy clock; and
a processor in communication with a memory, the processor;
receiving data items from each of a plurality of sensors;
associating a time stamp generated by the low-power and/or low accuracy clock with each data item received from each of the plurality of sensors;
storing the received data items for a predetermined period of time; and
a transmitter for transmitting said stored received data items; and
a remote site:
receiving the stored data items;
processing the stored data items to determine a high power and/or high accuracy clock for each of the stored data items, wherein determining said high power and/or high accuracy clock comprises:
approximating a correction of the time-stamp associated with the low-power and/or low accuracy clock based on a known time usage pattern;
refining the correction based on a known occupancy pattern associated with a second known time usage pattern; and applying the correction to the time-stamp associated with the low-power and/or low accuracy of the stored data.

* * * * *